OSCILLATOR TUNING ARRANGEMENT

Filed June 23, 1954 2 Sheets-Sheet 1

INVENTOR
GASTON SALMET
BY [signature]
AGENT

June 4, 1957 G. SALMET 2,794,920

OSCILLATOR TUNING ARRANGEMENT

Filed June 23, 1954 2 Sheets-Sheet 2

INVENTOR
GASTON SALMET

BY [signature]
AGENT 2,794,920
Patented June 4, 1957

2,794,920

OSCILLATOR TUNING ARRANGEMENT

Gaston Salmet, Courbevoie, France, assignor, by mesne assignments, to North American Philips Company, Inc., New York, N. Y., a corporation of Delaware Application June 23, 1954, Serial No. 438,821
Claims priority, application France June 23, 1953
4 Claims. (Cl. 250—36)

The present invention relates to an oscillator tuning arrangement. More particularly, the invention relates to an arrangement comprising an oscillator which is adapted to be stabilized at one of a number of control-frequencies and which is provided with a variable tuning circuit (comprising a tuning member) for selecting this stabilizing control frequency; the tuning circuit being coupled to a frequency correction tube which is controlled by a control voltage for automatic correction of the oscillator-frequency relatively to the selected stabilizing control-frequency.

If in such a circuit arrangement the tuning of the oscillator is continuously varied in a predetermined sense by the tuning member of the oscillator, the voltage produced by this oscillator is successively stabilized at every control-frequency in the traversed frequency band. Each time when traversing one of the stabilizing zones, each of which is determined by a control frequency, the anode current supplied by the frequency correction tube varies gradually between two extreme values, which values correspond to the extremities of each of the said stabilizing zones. Between two stabilizing zones, the said anode current is substantially constant and has an intermediate value between the said extreme values. When entering a stabilizing zone the anode current suddenly assumes the entering extreme value, thereupon it varies gradually until it has assumed the leaving extreme value, and then again assumes the said constant value until it enters the next stabilizing zone.

The value of the anode current supplied by the frequency correction tube thus provides an indication that the oscillator tuning passes through a stabilizing zone.

The said anode current variation is utilized in an arrangement of the aforementioned type in order to ensure that the tuning of the oscillator is automatically effected after the selection of a control frequency until the anode current of the frequency correction tube has assumed a normal operating value.

According to the invention this is ensured in that, for selecting the stabilizing control frequency, provision is made of a selecting switch and a tuning motor which controls the adjustment of the tuning member and the adjustment of a sequence switch. The supply circuit of the motor is closed via the rest contact of a switching relay, the supply circuit of which contains in succession the selecting switch, the sequence switch and an operating contact of an auxiliary relay connected in the anode circuit of the frequency correction tube. Thus, the supply circuit of the tuning motor is cut off by the rest contact of the switching relay only when the sequence switch has assumed a position corresponding to that of the selecting switch and, in addition when, the anode current of the frequency correction tube is at a normal operating value.

Preferably the tuning member is provided with an electromagnetic brake the supply circuit of which comprises in succession the selecting switch, the sequence switch and the contact of the auxiliary relay.

The invention will now be described with reference to the accompanying drawing, wherein.

If the tuning member of an oscillator, for example a variable capacitor, of the aforementioned type, is gradually rotated in a predetermined sense the oscillator tuning slowly traverses the entire frequency range. Assuming that the tuning member has a linear frequency characteristic, the oscillator tuning is substantially a linear function of the adjustment of the tuning member.

Figures 1, 2, 3:
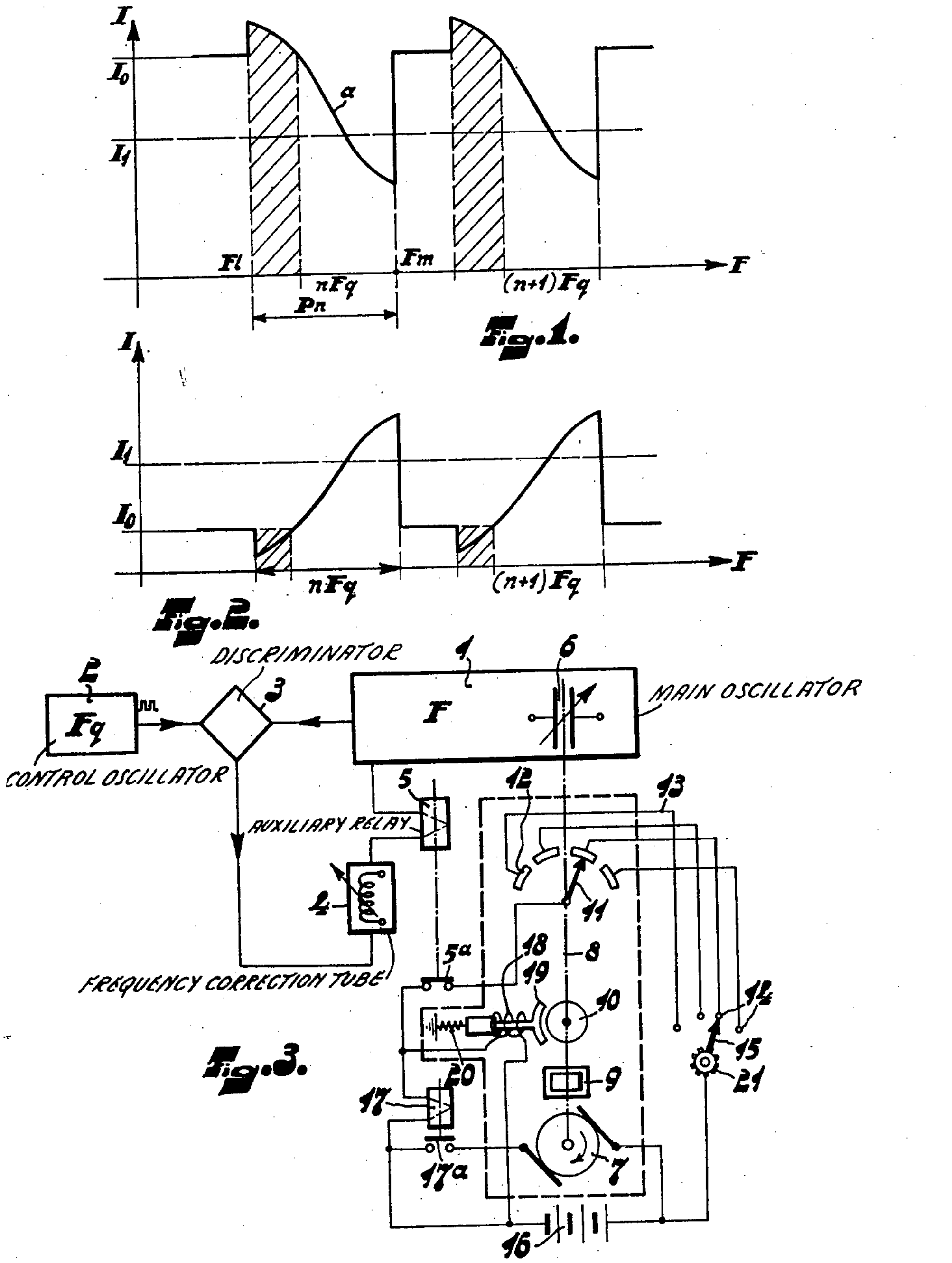
Figs. 1 and 2 are diagrams which show the variation of the anode current strength of a frequency correction tube if the oscillator tuning is continuously varied in one sense and in the other respectively by means of the tuning member of an oscillator adapted to be stabilized at one of a number of control frequencies.
Fig. 3 is a schematic diagram of an embodiment of a frequency selecting arrangement of the present invention partly in block diagram form.

Fig. 1 shows the variation of the anode current of the frequency correction tube of such an oscillator which is gradually detuned. The frequency correction tube acts as an inductive reactance. In the absence of stabilization the anode current has the value $I_0$. When a stabilizing zone $P_n$ is reached, which corresponds to a control frequency $nF_q$, this value is suddenly increased. When detuning is continued, the strength of this anode current decreases until the instant at which the oscillator is no longer stabilized because the frequency correction tube is no longer capable of effecting a sufficient frequency correction. The value of the anode current is then again suddenly increased to $I_0$. If the tuning member is moved further, the same phenomena are repeated with respect to the next stabilizing zone corresponding to $(n+1)F_q$.

Automatic frequency correction ("catching") is effected if the oscillator is so tuned that the value of the anode current of the frequency correction tube after catching exceeds $I_0$. These "catching zones" are shown in the stabilizing zones by shading.

Fig. 2 shows the variation of the anode current of the frequency correction tube of an oscillator which is gradually detuned to higher frequencies, if the frequency correction tube is connected as a capacitive reactance. The curve of Fig. 2 can be regarded as the reverse of that shown in Fig. 1. Initially, the anode current $I_0$ of the frequency correction tube decreases when a stabilizing zone corresponding to a control freqeuncy $nF_q$ is reached on catching. If detuning is continued, the anode current increases up to the moment at which the oscillator is no longer stabilized, because the frequency correction tube is no longer capable of effecting a sufficient frequency correction. The anode current then again suddenly assumes the value $I_0$. On further movement of the tuning member, the same phenomena are repeated with respect to the next stabilizing zone corresponding to $(n+1)F_q$.

Figure 4:
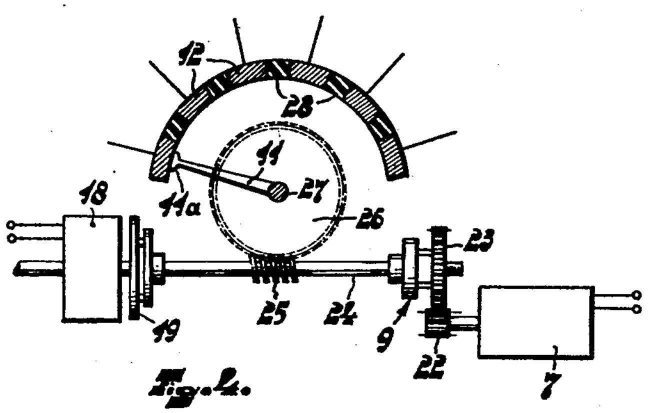
Fig. 4 is a schematic front view of one embodiment of the mechanical part of Fig. 3, which is surrounded by broken lines.

The circuit arrangement of Fig. 3 comprises a main oscillator 1 which is adapted to be stabilized at one of a number of control frequencies provided by a control oscillator 2. Oscillator 1 is conventional in form and may consist, for example, of a regenerative feedback oscillator such as shown in U. S. Patent No. 2,574,482, issued November 13, 1951, to E. H. Hugenholtz. The control oscillator 2 is a pulse generator and may be of the form shown in Fig. 8, page 137 of the publication Philips Technical Review, vol. 14, No. 5, November 1952. The tuning circuit of the main oscillator 1 comprises a tuning member 6 for selecting one of the stabilizing control frequencies. Coupled to the oscillator 1 is a frequency correction tube 4, which may consist of a conventional reactance tube such as shown in Fig. 4 of the above-noted patent. The said tube is provided with the winding of a relay 5 in its anode circuit for the purpose later to be more fully discussed. The control voltage required to be supplied to the frequency correction tube 4 for automatic correction of the oscillator frequency relatively to the selected stabilizing frequency is taken from a discriminator 3 constituted by a mixer stage such as shown in Fig. 1 of the above-noted patent, which mixer has the voltages required to be compared as to frequency or to phase supplied to it.

According to the invention, provision is made of a selecting switch 21 and a tuning motor 7 for selecting the stabilizing control frequency. By means of a mechanical transmission, which is shown diagrammatically by the broken line 8, the tuning motor controls the adjustment of the tuning member 6 and of a sequence switch 11. The mechanical transmission comprises an overload clutch 9 and an electromagnetic brake 10 which applies its braking force between the said clutch and the sequence switch 11, its brake shoe 19 being rendered inoperative by a spring 20 when the electromagnet 18 is not energized. The supply circuit of the tuning motor 7, which circuit is connected to the voltage supply 16, is closed through a rest contact **17*a* of a switching relay 17. The supply circuit of this switching relay 17 and the energizing circuit of the electromagnetic brake comprise in succession the selecting switch 21, the sequence switch 11 and an operating contact 5*a* of the auxiliary relay 5 connected in the anode circuit of the frequency correction tube 4**.

In the embodiment of Fig. 3 it is assumed that the frequency range of the main oscillator 1 comprises only four stabilizing zones.

Correspondingly, the selecting switch 21 and the sequence switch 11 of Fig. 3 each comprise only four contact pieces designated 14 and 12 respectively. The contact pieces 12 are connected to corresponding contact pieces 14 by means of conductors 13. Each of the contact pieces 12 and 14 respectively corresponds to one of the four stabilizing zones.

The described circuit arrangement operates as follows:

If by manual adjustment of the selecting switch 21, a control frequency the stabilizing zone of which corresponds to one of the four contact pieces 12 has been selected, the supply circuit of the switching relay 17 is interrupted by this adjustment of the selecting switch or by the operating contact **5*a* of the auxiliary relay 5, or by both. The supply circuit of the tuning motor 7 is in this event closed through the rest contact 17*a*. In addition, the electromagnetic brake 10 is rendered inoperative so that the motor 7 starts. The tuning member 7 and the sequence switch 11 are rotated and the tuning range of the main oscillator 1 is traversed. Each time, when passing through a stabilizing zone, the contact 5*a* is closed once by the auxiliary relay 5 if the anode current of the frequency correction tube 4** drops below a predetermined value $I_1$ (Fig. 1).

However, this closing has no further effect so long as the sequence switch 11 driven by the motor 7 and the selecting switch 21 have not yet assumed a like position.

When the sequence switch 11 has assumed a position corresponding to that of the selecting switch 21, the motor 7 initially runs on and consequently the tuning member 6 is also moved on until the contact **5*a* of the auxiliary relay 5 closes. At this instant the supply circuit of the switching relay 17 is closed and consequently the supply circuit of the motor 7 is interrupted by the contact 17*a*. Simultaneously, the electromagnetic brake 10 stops the sequence switch 11 and the tuning member 6. The overload clutch 9, however, permits the motor 7, which may have a high inertia, to run out. Thus, the instant at which the tuning member is stopped on reaching the selecting control frequency is determined by the strength of the anode current of the frequency correction tube 4. Consequently, by a suitable arrangement of the sensitiveness of the auxiliary relay 5, connected in the anode circuit of the frequency correction tube 4**, this instant can be chosen such that the oscillator tuning is stopped substantially exactly at the midpoint of the stabilizing zone of the selected control frequency; that is, when the anode current of the frequency correction tube has assumed a particularly suitable operating value.

The part of Fig. 3 surrounded by broken lines may be designed mechanically in the manner shown in Fig. 4.

Figure 5:
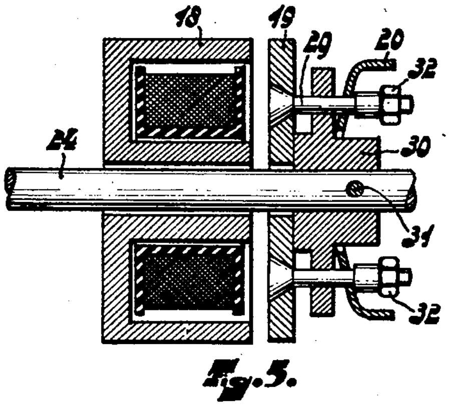
Fig. 5 is a schematic sectional view, in enlarged scale, of the details of the electromagnetic brake component of Fig. 4.

The motor 7 is connected through a reduction gear 22, 23 to drive a shaft 24 which is coupled to the gear wheel 23 by means of an overload clutch 9. The electromagnetic brake comprising a stationary electromagnet 18 and an annular plate 19 which acts as the brake shoe, is coaxially positioned in the shaft 24. Fig. 5 shows in detail a preferred embodiment of the electromagnetic brake.

Through a worm 25 and a gear wheel 26 the shaft 24 drives a shaft 27 to which a sliding contact 11 and the movable plates of the variable capacitor are secured. The end **11*a* of the sliding contact is resilient and slides along the contact pieces 12 and the insulating intermediate pieces 28 which are arranged between the said contact pieces to prevent interruption of the surface wiped by the end of the sliding contact 11**.

In the embodiment of the electromagnetic brake of Fig. 5, a flat ring 19, which forms the movable armature of the electromagnet 18, is provided with bolts 29 which slide in axial bores formed in a shoulder 30 which is keyed to the shaft 24 by a pin 31. The spring 20 consists of a resilient plate or dish from which the nuts 32 secured to the ends of the bolts are supported.

Figure 6:
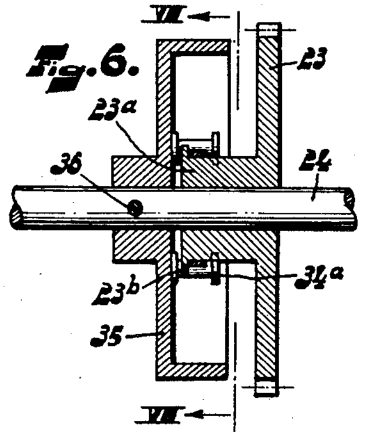
Fig. 6 is a schematic sectional view, in enlarged scale of the details of the overload clutch component of Fig. 4.
Figure 7:
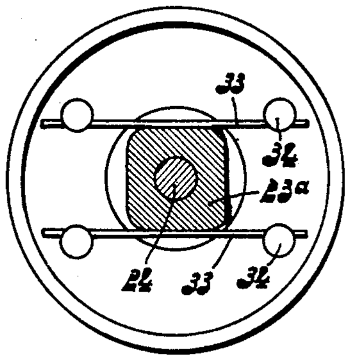
Fig. 7 is a schematic sectional view, through line VII—VII, of the overload clutch of Fig. 6.

Figs. 6 and 7 show an embodiment of the overload clutch.

The gear wheel 23, which is freely mounted on the shaft 24, comprises a hub **23*a*, of substantially square cross-section with rounded corners. The front faces of the hub 23*a* are clamped between two plate springs 33 which are supported from projections 34 arranged on a roller 35 which is keyed to the shaft 24 by a pin 36. The end 23*b* of the hub 23*a* and the ends 34*a* of the projections 34 are provided with projecting rims in order to prevent any likelihood of a displacement of the plate springs 33** which are held only by their resilience.

It will be appreciated that if the shaft 24 is stopped by the electromagnetic brake the gear wheel 23 is enabled to continue its rotation in that it bends the two plate springs 33 outward at each quarter turn.

While the invention has been described by means of a specific example and in a specific embodiment, I do not wish to be limited thereto, for obvious modifications will occur to those skilled in the art without departing from the spirit and scope of the invention.

What is claimed is:

1. An oscillator tuning arrangement comprising an oscillator having a movable tuning member for varying the frequency of said oscillator over a given tuning range, means for adjusting the frequency of said oscillator to a desired one of a plurality of frequency values within said range, comprising a tuning motor coupled to said member for adjusting the position thereof to a given one of a plurality of positions substantially corresponding to said frequency values, a sequence switch coupled to said tuning member and a selector switch each having a plurality of contact positions corresponding in number to the number of said tuning member positions, a source operative to produce reference signals of a plurality of fixed frequencies, means for producing a control signal having a value as determined by the difference between the frequency of said oscillator and a given one of said reference signals, a frequency correction tube coupled to said oscillator and energized by said control signal, said correction tube operating at an output current within a given range when the said frequency difference is within the control range of said correction tube and operating at an output current beyond said given range when the said frequency difference is greater than the control range of said tube, an auxiliary relay having the energizing means thereof connected to the output circuit of said correction tube, a switching relay, a first circuit comprising said sequence and selector switches, the energizing means of said switching relay and switch contacts actuated by said auxiliary relay, and a second circuit comprising a supply circuit for said motor and switch contacts actuated by said switching relay, said auxiliary relay being operative to actuate said last-mentioned switch contacts to the open circuit position thereof solely when the sequence switch and the selector switch assume corresponding positions and the output current of said correction tube has a value within the said given range.

2. An oscillator arrangement as claimed in claim 1, further comprising an electromagnetic brake member coupled to said tuning member, said brake member comprising an energizing element connected in series with said sequence and selector switches and the said contacts of said auxiliary relay.

3. An oscillator arrangement as claimed in claim 1, further comprising an overload releasing clutch arrangement interposed between said tuning motor and said tuning member.

4. An oscillator arrangement as claimed in claim 3, wherein said overload releasing clutch arrangement comprises a rotatable shaft, two flat springs arranged parallel to each other on either side of said shaft, and a hub member having a non-circular perimeter surrounding said shaft and interposed between said plate springs.

References Cited in the file of this patent

UNITED STATES PATENTS

| | | |
|---|---|---|
| 2,218,905 | Cooper | Oct. 22, 1940 |
| 2,568,412 | Robinson | Sept. 18, 1951 |
| 2,704,329 | Law | Mar. 15, 1955 |